US007550323B2

(12) United States Patent
Chidambarrao et al.

(10) Patent No.: US 7,550,323 B2
(45) Date of Patent: Jun. 23, 2009

(54) ELECTRICAL FUSE WITH A THINNED FUSELINK MIDDLE PORTION

(75) Inventors: Dureseti Chidambarrao, Weston, CT (US); William K. Henson, Beacon, NY (US); Deok-kee Kim, Bedford Hills, NY (US); Chandrasekharan Kothandaraman, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 57 days.

(21) Appl. No.: 11/835,800

(22) Filed: Aug. 8, 2007

(65) Prior Publication Data

US 2009/0042341 A1 Feb. 12, 2009

(51) Int. Cl.
*H01L 21/82* (2006.01)

(52) U.S. Cl. ....................... 438/128; 438/510; 438/597; 257/E21.17; 257/E21.593; 257/E21.218; 257/E21.229; 257/E21.498

(58) Field of Classification Search ................. 438/128, 438/131, 132, 510, 384, 603, 604, 597, 601, 438/649, 679, 680, 682, 683, 685, 686, 706, 438/712, 645, 752, 753
See application file for complete search history.

(56) References Cited

U.S. PATENT DOCUMENTS

| | | | |
|---|---|---|---|
| 4,679,310 | A | 7/1987 | Ramachandra et al. |
| 5,365,105 | A | 11/1994 | Liu et al. |
| 5,955,275 | A | 9/1999 | Kamb |
| 5,969,404 | A * | 10/1999 | Bohr et al. .................. 257/529 |
| 6,204,132 | B1 | 3/2001 | Kittl et al. |
| 6,274,440 | B1 | 8/2001 | Arndt et al. |
| 6,326,289 | B1 | 12/2001 | Rodder et al. |
| 6,384,664 | B1 | 5/2002 | Hellums et al. |
| 6,507,087 | B1 | 1/2003 | Yu |
| 6,642,601 | B2 | 11/2003 | Marshall et al. |
| 6,661,330 | B1 | 12/2003 | Young |
| 6,958,523 | B2 | 10/2005 | Babcock et al. |
| 6,982,610 | B2 | 1/2006 | Govind |
| 6,984,550 | B2 | 1/2006 | Yamazaki et al. |
| 2003/0160297 | A1 * | 8/2003 | Kothandaraman et al. ... 257/529 |

* cited by examiner

*Primary Examiner*—David Nhu
(74) *Attorney, Agent, or Firm*—Scully, Scott, Murphy & Presser, P.C.; Joseph P. Abate, Esq.

(57) ABSTRACT

A metal layer is deposited on the patterned semiconductor material layer containing a cathode semiconductor portion, a fuselink semiconductor portion, and an anode semiconductor portion. The metal layer may be patterned so that a middle portion of the fuselink semiconductor portion has a thin metal layer, which upon annealing produces a thinner metal semiconductor alloy portion than surrounding metal semiconductor alloy portion on the fuselink semiconductor portion. Alternatively, a middle portion of the metal semiconductor alloy having a uniform thickness throughout the fuselink may be lithographically patterned and etched to form a thin metal semiconductor alloy portion in the middle of the fuselink, while thick metal semiconductor alloy portions are formed on the end portions of the fuselink. The resulting inventive electrical fuse has interfaces at which a thinner metal semiconductor alloy abuts a thicker metal semiconductor alloy in the fuselink to enhance the divergence of electrical current.

11 Claims, 3 Drawing Sheets

90 94A 94B 94C 92
30 40A 40B 40C 32
20 50
10

20
A A'
94A 94B 94C
90 92
50

ELECTRICAL FUSE WITH A THINNED FUSELINK MIDDLE PORTION

FIELD OF THE INVENTION

The present invention relates to semiconductor devices, and particularly to a programmable semiconductor fuse with enhanced programming characteristics.

BACKGROUND OF THE INVENTION

Electrically programmable semiconductor fuses, or electrical fuses in short as it is referred to in this invention, have been used in semiconductor circuits to provide alterations in the functionality of the circuitry. Typical examples of applications of electrical fuses include: providing redundancy to enable repairs of imperfect chips, storage of secure and permanent information, selection of a particular configuration for chip operation, tuning analogue circuit components, optimizing overall circuit performance, and/or replacing defective circuit elements with redundant circuit elements.

Electrical fuses are programmed by the physical alteration of the structure of the electrical fuses. The most commonly used structure of electrical fuses employs a vertical stack comprising a semiconducting material and a conducting material. While the most common material for the vertical stack is polysilicon and silicide, other semiconducting materials and other conducting materials may be utilized if similar electromigration properties can be found in the combined stack of the two materials. In general, the stack comprises a layer of semiconductor material and a layer of a metal semiconductor alloy, which may be a silicide. This stack is patterned such that a narrow and long piece of material, called "fuselink" or "fuse neck," is adjoined by two large plates, called "cathode" and "anode" respectively, depending on the polarity of electrical bias applied to the electrical fuse during programming. Electrical current of relatively high density flows through the fuselink when a sufficiently high voltage bias is applied across the cathode and the anode. The programming current may be high enough to cause the electrical fuses to rupture by a sudden increase in temperature in the physical structure of the electrical fuses. This type of programming is commonly referred to as "rupture mode programming." Alternatively, the level of the programming current may be moderated to cause a controlled electromigration of the material inside the electrical fuse structure. This alternative mode of programming is commonly referred to as "electromigration mode programming." Both programming methods raise the resistance of the programmed fuse compared to that of intact fuses.

By measuring the resistance of electrical fuses, it can be determined whether the electrical fuse has been programmed or intact. While it may not be necessary to measure the exact value of the fuse resistance to determine the state of the fuse, it is generally necessary to determine whether the fuse resistance has been raised by a significant amount above the detection limit of the sensing circuitry. Typically, this is done by setting the resistance for a reference resistor at a value about 3~10 times that of an intact electrical fuse and comparing the resistance of the fuse with that of the reference resistor. A difference between the resistance of the reference resistor and the resistance of an intact fuse is often necessary to insure margin in the functionality of the sensing circuitry under adverse operating conditions of the chip.

Reliable programming of electrical fuses in an electromigration mode requires a minimum level of divergence of electrical current density at the cathode to induce electromigration of a metal semiconductor alloy at the cathode. While the divergence of electrical current is proportional to the magnitude of the electrical current through the fuselink, the size of a programming transistor, and correspondingly, the area occupied by the programming transistor, are proportional to the magnitude of the electrical current to be supplied to the fuselink during programming. However, the divergence of electrical current is also a function of geometry of the electrical fuse structure. In principle, the paths of the electrical current for programming an electrical fuse may be engineered to induce a higher level of divergence of electrical current density by manipulating the geometry of the electrical fuse structure.

Therefore, an electrical fuse structure that produces a high level of divergence of electrical current at the cathode, and methods of manufacturing the same are desired.

SUMMARY OF THE INVENTION

The present invention provides an electrical fuse structure having a geometry that facilitates programming by forming a thin metal semiconductor alloy in a middle portion of a fuselink, while forming thick metal semiconductor alloys abutting the thin metal semiconductor alloy on the rest of the fuselink, and methods of manufacturing the same.

Specifically, the present invention provides an electrical fuse structure in which a middle portion of a fuselink has a thin metal semiconductor alloy that abuts thick metal semiconductor alloys on end portions of the fuselink, thus enhancing the divergence of the current at a cathode and facilitating programming of the electrical fuse. The thick metal semiconductor alloy and the thin metal semiconductor alloy comprise substantially the same material. To form the inventive electrical fuse, a layer of semiconductor material is patterned to form a cathode semiconductor portion, a fuselink semiconductor portion, and an anode semiconductor portion. A metal layer is deposited on the patterned semiconductor material layer.

In one embodiment, the metal layer is patterned so that a middle portion of the fuselink semiconductor portion has a thin metal layer, while the end portions of the fuselink have thick metal layers. The metal layers react with the underlying semiconductor material to form a thin metal semiconductor alloy portion in the middle of the fuselink, while thick metal semiconductor alloy portions are formed on the end portions of the fuselink.

In another embodiment, the metal layer deposited on at least the fuselink and having substantially the same thickness over the area of the fuselink is annealed to react with underlying semiconductor material to form a metal semiconductor alloy of uniform thickness throughout the fuselink. A middle portion of the metal semiconductor alloy is lithographically patterned and etched to form a thin metal semiconductor alloy portion in the middle of the fuselink, while thick metal semiconductor alloy portions are formed on the end portions of the fuselink.

According to an aspect of the present invention, a first method of manufacturing an electrical fuse is provided, which comprises:

forming a layer of semiconductor material on a semiconductor substrate;

patterning the layer of the semiconductor material into a cathode semiconductor portion, a fuselink semiconductor portion, and an anode semiconductor portion, wherein the fuselink semiconductor portion laterally abuts the cathode semiconductor portion and the anode semiconductor portion;

forming a metal layer directly on at least the entirety of a top surface of the fuselink semiconductor portion;

partially etching a segment of the metal layer over a middle portion of the fuselink semiconductor portion, while not etching segments of the metal layer over two end portions of the fuselink semiconductor portion; and forming metal semiconductor alloy portions having a first thickness at least on the two end portions of the fuselink semiconductor portion, while forming a second metal semiconductor alloy portion having a second thickness on the middle portion of the fuselink, wherein the second thickness is less than the first thickness.

In one embodiment, the first metal semiconductor alloy portion and the second metal semiconductor alloy portion have substantially the same composition.

In another embodiment, the first metal semiconductor alloy portion and the second metal semiconductor alloy may comprise a metal silicide.

The method may further comprise forming shallow trench isolation located in the semiconductor substrate, wherein the shallow trench isolation abuts the cathode semiconductor portion, the fuselink semiconductor portion, and the anode semiconductor portion.

In some embodiments, the cathode semiconductor portion, the fuselink semiconductor portion, and the anode semiconductor portion may have substantially the same height.

In further embodiments, the cathode semiconductor portion, the anode semiconductor portion, the fuselink semiconductor portion may be doped substantially at the same doping concentration and with the same dopant type.

According to another aspect of the present invention, a second method of manufacturing an electrical fuse is provided, which comprises:

forming a layer of semiconductor material on a semiconductor substrate;

patterning the layer of the semiconductor material into a cathode semiconductor portion, a fuselink semiconductor portion, and an anode semiconductor portion, wherein the fuselink semiconductor portion laterally abuts the cathode semiconductor portion and the anode semiconductor portion;

forming a metal semiconductor alloy layer having substantially the same first thickness directly on at least the entirety of a top surface of the fuselink semiconductor portion; and partially etching a segment of the metal semiconductor alloy layer over a middle portion of the fuselink semiconductor portion to a second thickness, while not etching segments of the metal semiconductor alloy layer over two end portions of the fuselink semiconductor portion, wherein the second thickness is less than the first thickness.

In one embodiment, the metal semiconductor alloy layer may comprise a metal silicide.

In another embodiment, the method may further comprise forming shallow trench isolation located in the semiconductor substrate, wherein the shallow trench isolation abuts the cathode semiconductor portion, the fuselink semiconductor portion, and the anode semiconductor portion.

In a further another embodiment, the cathode semiconductor portion, the fuselink semiconductor portion, and the anode semiconductor portion may have substantially the same height.

In a yet another embodiment, the cathode semiconductor portion, the anode semiconductor portion, the fuselink semiconductor portion may be doped substantially at the same doping concentration and with the same dopant type.

BRIEF DESCRIPTION OF THE DRAWINGS

FIG. 2 is a vertical cross-sectional view. Figures with the suffix "A" are vertical cross-sectional views, and are taken along the plane A-A' if shown in another figure with the sane numerical label. Figures with the suffix "B" are top-down views of the corresponding figure with the same numeric label and the suffix "A. " FIG. 1C is a horizontal cross-sectional view of the structure in FIG. 1A along the plane C-C'.

FIG. 4 is a vertical cross-sectional view. FIG. 5A is a vertical cross-sectional view of the structure in FIG. 5B long the plane A-A'. FIG. 5B is a top-down view of the structure in FIG. 5A.

DETAILED DESCRIPTION OF THE INVENTION

Figure 1A:
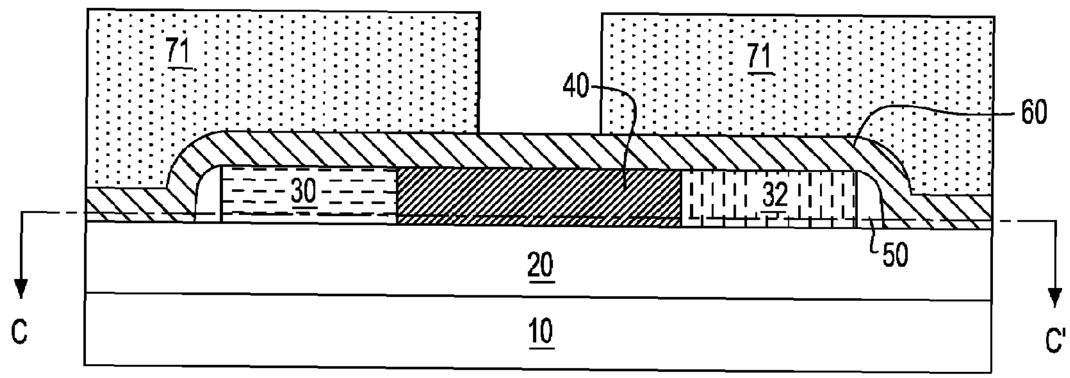
FIGS. 1A-1C, 2, and 3A-3B show structures of a first exemplary electrical fuse according to a first aspect of the present invention at various stages of a manufacturing sequence.

As stated above, the present invention relates to a programmable semiconductor fuse with enhanced programming characteristics and methods of manufacturing the same, which are now described in detail with accompanying figures. It is noted that like and corresponding elements are referred to by like reference numerals.

Figure 1B:
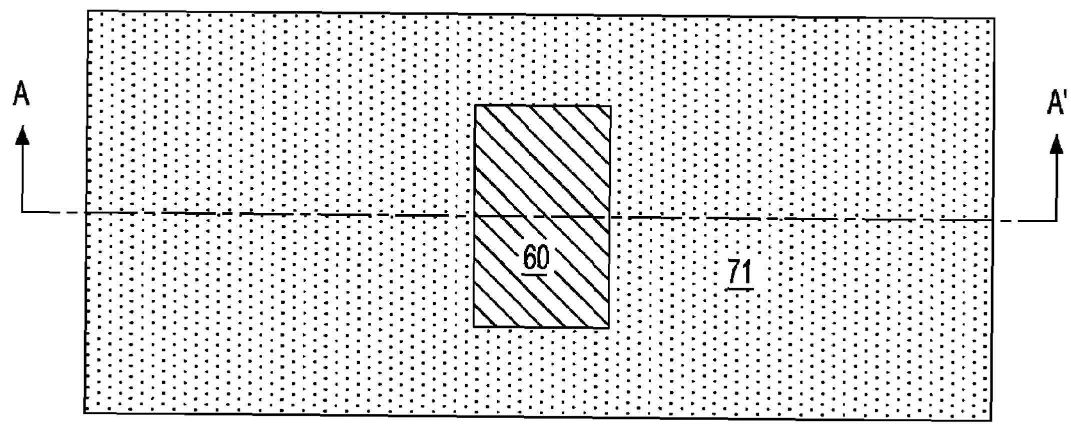
Figure 1C:
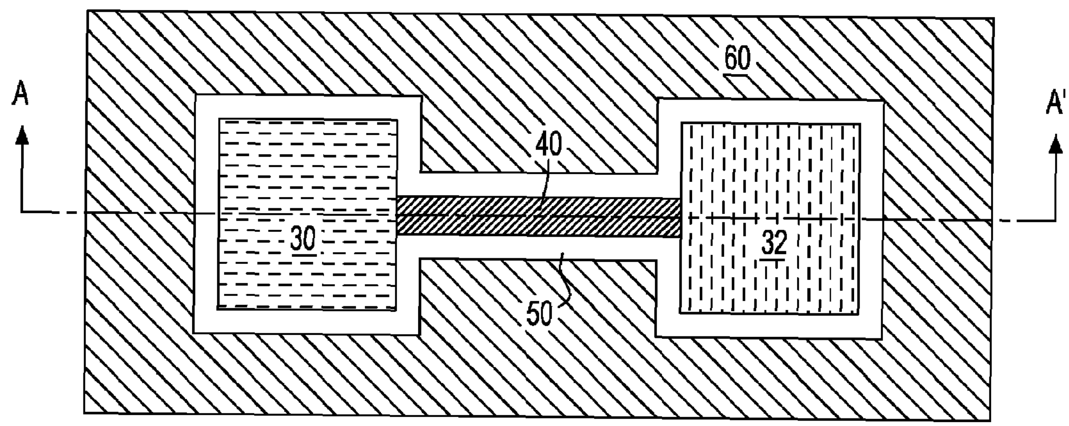
Figure 2:
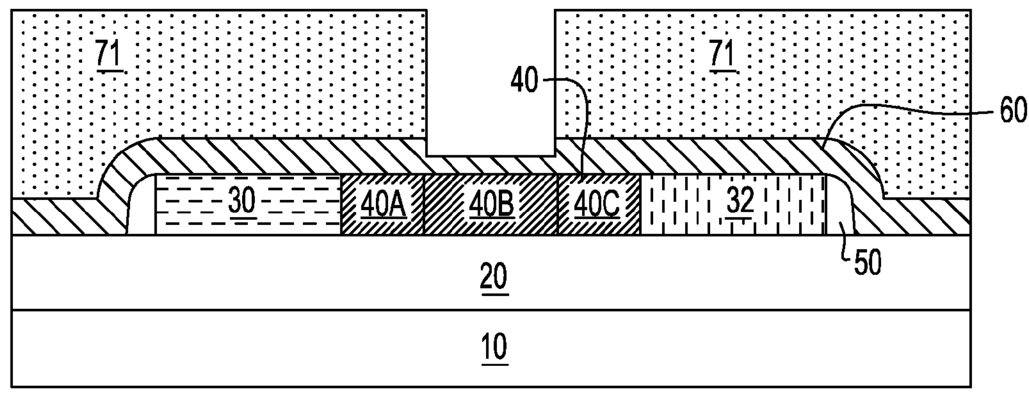

Referring to FIGS. 1A-1C, an exemplary semiconductor structure according to the present invention comprises a semiconductor substrate containing shallow trench isolation 20 located in a substrate semiconductor layer 10, a cathode semiconductor portion 30, a fuselink semiconductor portion 40, and an anode semiconductor portion 32. The fuselink semiconductor portion 40 laterally abuts the cathode semiconductor portion 30 and the anode semiconductor portion 32. Preferably, the cathode semiconductor portion 30, the fuselink semiconductor portion 40, and the anode semiconductor portion 32 are formed by depositing and lithographically patterning a layer of semiconductor material.

The semiconductor material may be amorphous or polycrystalline. Further, the semiconductor material may comprise silicon, germanium, carbon, III-V semiconductor alloy, II-VI semiconductor alloy, and/or a combination thereof. Each of the cathode semiconductor portion 30, the fuselink semiconductor portion 40, and the anode semiconductor portion 32 may, or may not, be doped with dopants to optimize performance of an electrical fuse to be formed. Preferably, a dielectric spacer 50 is formed on the periphery of the collective structure of the cathode semiconductor portion 30, the fuselink semiconductor portion 40, and the anode semiconductor portion 32.

A metal layer 60 is deposited directly on at least the entirety of the top surface of at least the fuselink semiconductor portion 40. Preferably, the metal layer 60 is deposited on the entire top surface of the exemplary semiconductor structure. Optionally, portions of the metal layer 60 may removed by a combination of lithographic methods and reactive ion etching outside the area of the fuselink semiconductor portion 40.

The metal layer 60 comprises a metal capable of forming a metal semiconductor alloy when reacted with the semiconductor material of the cathode semiconductor portion 30, the fuselink semiconductor portion 40, and the anode semiconductor portion 32. For example, the cathode semiconductor portion 30, the fuselink semiconductor portion 40, and the anode semiconductor portion 32 may comprise silicon and the metal layer 60 may comprise a metal or a metal alloy that may form a silicide. For example, the metal or the metal alloy may comprise elements such as Ta, Ti, Co, W, Ni, Pt, Os, Ir, Mo, and/or other transition metals and refractory metals.

The thickness of the metal layer 60 may be from about 4 nm to about 40 nm, and typically from about 8 nm to about 15 nm. The metal layer 60 may be deposited, for example, by physical vapor deposition (PVD).

A photoresist 71 is applied over the top surfaces of the metal layer 60 and lithographically patterned to expose an area of the metal layer 60 located over a middle portion of the fuselink semiconductor portion 40, while covering areas of the metal layer 60 located over the end portions of the fuselink semiconductor layer 40. The exposed segment of the metal layer 60 located above the middle portion of the fuselink semiconductor portion 40 is partially etched. The exposed segment of the metal layer 60 is recessed by a recess depth, i.e., the thickness of the removed portion of the metal layer 60. The recess depth is from about 20% to about 80% of the thickness of the metal layer 60, and preferably from about 35% to about 65% of the thickness of the metal layer 60. Segments of the metal layer 60 over two end portions of the fuselink semiconductor portion 40 are not etched since the photoresist 71 covers the top surfaces of these segments of the metal layer 60.

The fuselink semiconductor portion 40 is subdivided into three sub-portions for the purpose of description of the present invention. The portion of the fuselink semiconductor portion 40 directly underneath the thinned portion of the metal layer 60 constitutes a second semiconductor portion 40B. The portion of the fuselink semiconductor portion 40 between the cathode semiconductor portion 30 and the second semiconductor portion constitutes a first semiconductor portion 40A. The portion of the fuselink semiconductor portion 40 between the anode semiconductor portion 32 and the second semiconductor portion constitutes a third semiconductor portion 40C.

The etching of the exposed portion of the metal layer 60 may be performed employing a wet etch or a dry etch. In the case of a metal layer 60 consisting of Ni, a first exemplary wet etch solution comprises 5 parts of $HNO_3$, 5 parts $CH_3COOH$, 2 parts $H_2SO_4$, and 28 parts of $H_2O$, which provides an etch rate of 250 nm/minute at room temperature. A diluted version of this solution may be employed to control the etch rate of the solution as needed. A second exemplary wet etch solution comprises aqua regia, which is a mixture of 5 parts of concentrated (37%) hydrochloric acid, 1 part concentrated (70%) nitric acid, and 4 parts of deionized water. Other wet etch chemistry or dry etch processes may be employed.

Figure 3A:
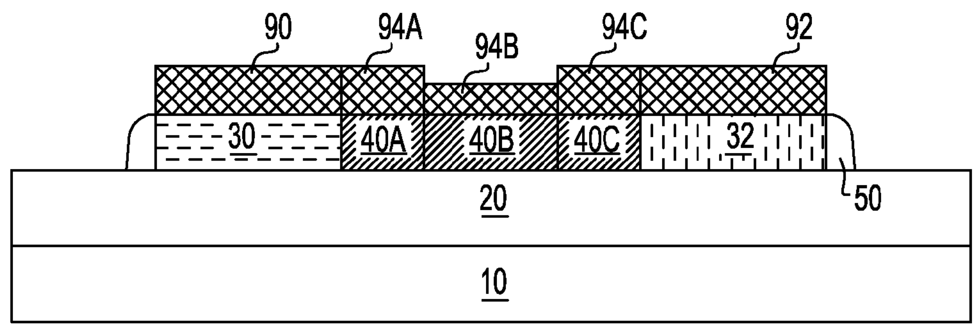
Figure 3B:
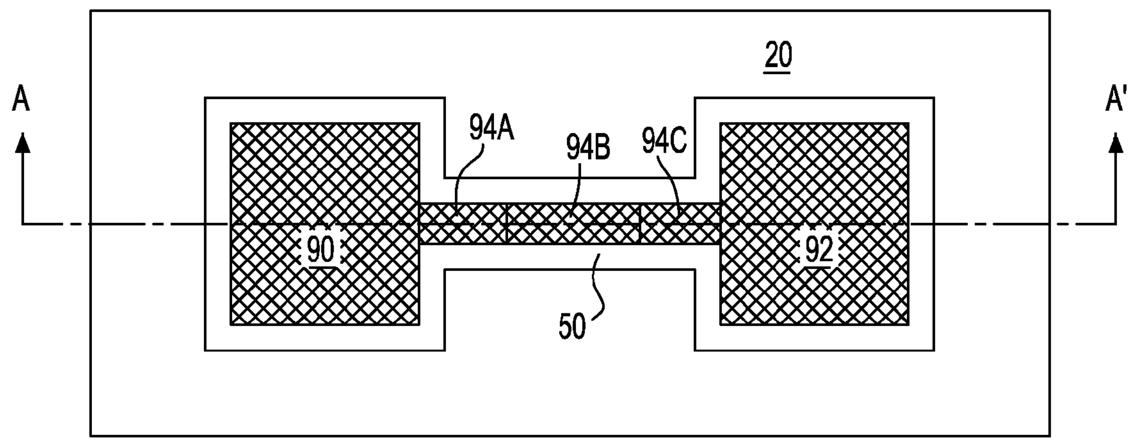

Referring to FIGS. 3A and 3B, the first exemplary structure is thereafter annealed at a pre-determined elevated temperature at which the metal layer 60 reacts with the underlying semiconductor material to form various metal semiconductor alloy portions. Methods of performing an anneal or multiple anneals are well known in the art. Metal semiconductor alloy portions having a first thickness are formed at least on the two end portions of the fuselink semiconductor portion 40, i.e., the first semiconductor portion 40A and the third semiconductor portion 40C. A fraction of the second semiconductor portion 40B reacts with the metal layer 60 to form a second metal semiconductor alloy portion 94B having a second thickness.

Preferably, metal semiconductor alloys are formed on all top surfaces of the patterned semiconductor layer. A fraction of the cathode semiconductor portion 30 reacts with the metal layer 60 to form a cathode metal semiconductor alloy portion 90 having a first thickness. A fraction of the anode semiconductor portion 32 reacts with the metal layer 60 to form an anode metal semiconductor alloy portion 92 having the first thickness. A fraction of the first semiconductor portion 40A reacts with the metal layer 60 to form a first metal semiconductor alloy portion 94A having the first thickness. A fraction of the third semiconductor portion 40C reacts with the metal layer 60 to form a third metal semiconductor alloy portion 94C having the first thickness.

Unreacted portions of the metal layer 60 is thereafter removed by an etch, which may be a wet etch. For example, a wet etch employing aqua regia may be employed. The etch is selective to the various metal semiconductor alloy portions (90, 92, 94A, 94B, 94C).

The second thickness is less than the first thickness. The various metal semiconductor alloy portions (90, 92, 94A, 94B, 94C) have substantially the same composition. In case the various semiconductor portions (30, 32, 40A, 40B, 40C) comprises silicon, the various metal semiconductor alloy portions (90, 92, 94A, 94B, 94C) may comprise a metal silicide.

The doping of the various semiconductor portions (30, 32, 40A, 40B, 40C) may, or may not, be the same. In one case, all of the various semiconductor portions (30, 32, 40A, 40B, 40C) have the same doping. In another case, the cathode semiconductor portion 30 is doped and the anode semiconductor portion 32 and the first, second, and third semiconductor portions (40A, 40B, 40C) are not doped. In yet another case, the cathode semiconductor portion 30 and the first semiconductor portion 40A are doped and the anode semiconductor portion 32 and the second and third semiconductor portions (40B, 40C) are not doped.

Since the resistivity of metal semiconductor alloys is about one to two orders of magnitude lower than the resistivity of highly doped semiconductor materials, programming current flows mostly through the various metal semiconductor alloy portions during programming. The abruptly changes in cross-sectional areas at the interface between the first metal semiconductor alloy portion 94A and the second metal semiconductor alloy portion 94B, and at the interface between the second metal semiconductor alloy portion 94B and the third metal semiconductor alloy portion 94C causes the current density to converge or diverge at the two interfaces. Therefore, the divergence of current density achieves high values at the two interfaces, and thus, facilitates electromigration between the two interfaces.

A middle-of-line (MOL) dielectric layer (not shown) is formed on the various metal semiconductor alloy portions (90, 92, 94A, 94B, 94C) and the shallow trench isolation 20. The MOL dielectric layer may comprise a silicon oxide, a silicon nitride, a chemical vapor deposition (CVD) low-k dielectric material, a spin-on low-k dielectric material, or a stack thereof. The MOL dielectric layer may contain a mobile ion diffusion barrier layer that prevents diffusion of mobile ions such as sodium and potassium from back-end-of-line (BEOL) dielectric layers. Further, the MOL dielectric layer may contain a stress liner that applies tensile or compressive stress on underlying structures to alter charge carrier mobility. Contacts are formed through the MOL dielectric layer to the cathode metal semiconductor alloy portion 90 and the anode metal semiconductor portion 92.

Figure 4:
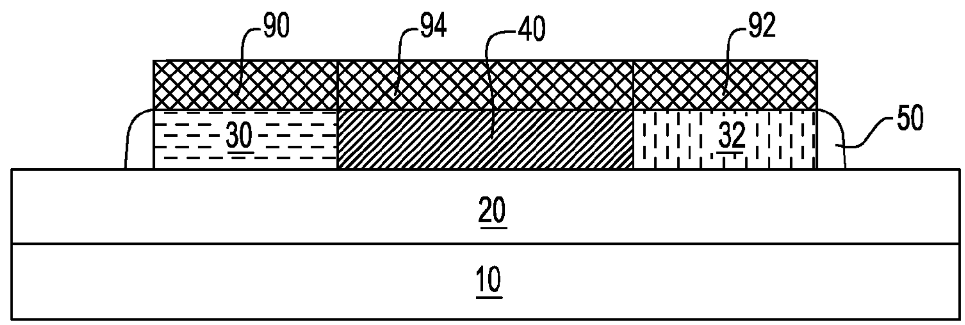
FIGS. 4, 5A, and 5B show structures of a second exemplary electrical fuse according to a second aspect of the present invention at various stages of a manufacturing sequence.

Referring to FIG. 4A, a second exemplary structure according to a second aspect of the present invention comprises a semiconductor substrate containing shallow trench isolation 20 located in a substrate semiconductor layer 10, a cathode semiconductor portion 30, a fuselink semiconductor portion 40, and an anode semiconductor portion 32. The fuselink semiconductor portion 40 laterally abuts the cathode semiconductor portion 30 and the anode semiconductor portion 32. A metal semiconductor alloy layer is formed directly on at least the entirety of the top surface of at least the fuselink semiconductor portion 40, and preferably on all of the cathode semiconductor portion 30, a fuselink semiconductor portion 40, and an anode semiconductor portion 32. A metal semiconductor alloy layer is subdivided into three portions: a cathode metal semiconductor alloy portion 90, an anode metal semiconductor alloy portion 92, and a fuselink metal semiconductor alloy portion 94. The cathode metal semiconductor alloy portion 90 is located directly on and above the cathode semiconductor portion 30. The anode metal semiconductor alloy portion 92 is located directly on and above the anode semiconductor portion 32. The fuselink metal semiconductor alloy portion 94 is located directly on and above the fuselink semiconductor portion 40.

The second semiconductor structure may be formed by omitting the application and patterning of the photoresist 71 in FIGS. 1A-1C, and performing an anneal to induce reaction of the metal layer 60 with the underlying semiconductor material to form the various metal semiconductor alloy portions (90, 92, 94). The same anneal process may be employed as in the first embodiment. The cathode metal semiconductor alloy portion 90, the anode metal semiconductor alloy portion 92, and the fuselink metal semiconductor alloy portion 94 have substantially the same composition and substantially the same thickness, i.e., a first thickness.

Figure 5A:
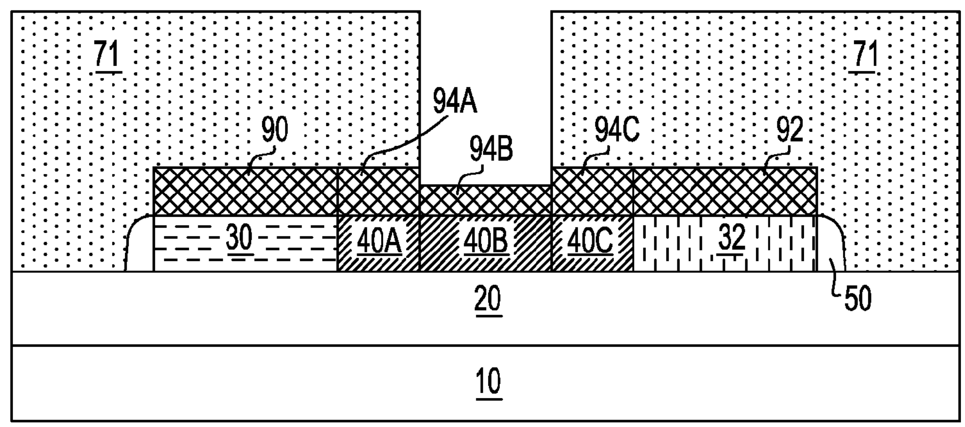
Figure 5B:
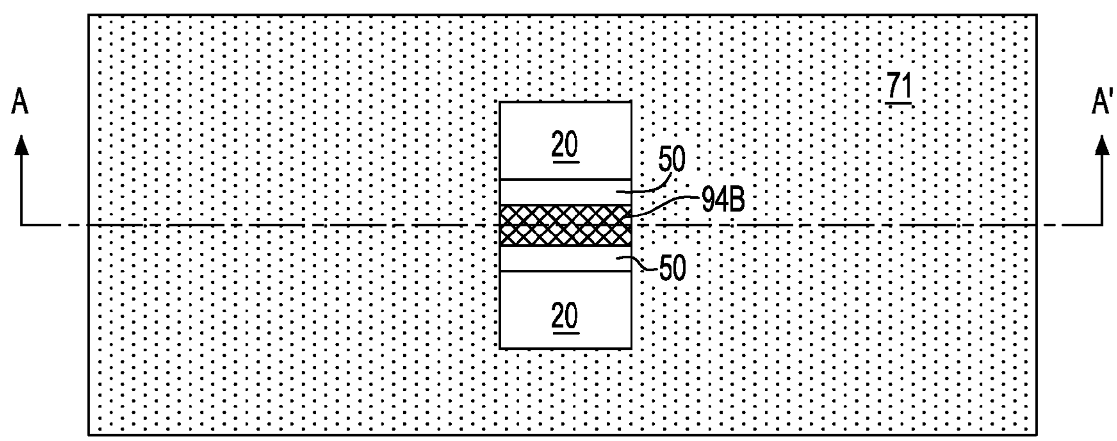

Referring to FIGS. 5A-5B, a photoresist 71 is applied over the top surfaces of the various metal semiconductor alloy portions (90, 92, 94) and lithographically patterned to expose an area of the fuselink metal semiconductor alloy portion 94 located over a middle portion of the fuselink semiconductor portion 40, while covering areas fuselink metal semiconductor alloy portion 94 over the end portions of the fuselink semiconductor layer 40.

For the purpose of description of the present invention, the fuselink metal semiconductor alloy portion 94 is subdivided into three segments. The exposed segment of the fuselink metal semiconductor alloy portion 94 constitutes a second metal semiconductor alloy portion 94B. The segment of the fuselink metal semiconductor alloy portion 94 between the cathode metal semiconductor alloy portion 90 and the second metal semiconductor alloy portion 94B constitutes a first metal semiconductor alloy portion 94A. The segment of the fuselink metal semiconductor alloy portion 94 between the anode metal semiconductor portion 92 and the second metal semiconductor alloy portion 94B constitutes a third metal semiconductor alloy portion 94C.

Likewise, the fuselink semiconductor portion 40 is also subdivided into three segments. The segment of the fuselink semiconductor portion 40 directly underneath the first metal semiconductor alloy portion 94A constitutes a first semiconductor portion 40A. The segment of the fuselink semiconductor portion 40 directly underneath the second metal semiconductor alloy portion 94B constitutes a second semiconductor portion 40B. The segment of the fuselink semiconductor portion 40 directly underneath the third metal semiconductor alloy portion 94C constitutes a third semiconductor portion 40C.

The exposed segment of the metal semiconductor alloy layer, i.e., the second metal semiconductor alloy portion 94B, located over a middle portion of the fuselink semiconductor portion, i.e., the second semiconductor portion 40B, is recessed to a second thickness, while the other segments of the metal semiconductor alloy layer, i.e., the first metal semiconductor alloy portion 94A and the third metal semiconductor alloy portion 94C, that are located over two end portions of the fuselink semiconductor portion, i.e., the first semiconductor portion 40A and the third semiconductor portion 40C, are not recessed. The second metal semiconductor alloy portion 94B is etched to a second thickness. The recess depth, i.e., the thickness of the removed portion of the second metal semiconductor alloy portion 94B, is from about 20% to about 80% of the thickness of the second metal semiconductor alloy portion 94B, and preferably from about 35% to about 65% of the thickness of the second metal semiconductor alloy portion 94B. The recess depth is equal to the difference between the first thickness and the second thickness.

The recessing, or etching, of the second metal semiconductor alloy portion 94B may be performed by a wet etch or a reactive ion etch. For example, reactive ion etch processes employing $CF_4$, $Cl_2$, CO, Ar, a combination of CO and $CF_4$, a combination of CO and $Cl_2$, or a combination of $CF_4$ and $O_2$ for etching metal semiconductor alloys such as metal silicides are known in the art.

After removing the patterned photoresist 71, the second exemplary structure has the same structure as the first exemplary structure in FIGS. 3A-3B.

A middle-of-line (MOL) dielectric layer (not shown) is formed on the various metal semiconductor alloy portions (90, 92, 94A, 94B, 94C) and the shallow trench isolation 20 as in the first embodiment. Contacts are formed through the MOL dielectric layer to the cathode metal semiconductor alloy portion 90 and the anode metal semiconductor portion 92.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of manufacturing an electrical fuse comprising:

forming a layer of semiconductor material on a semiconductor substrate; patterning said layer of said semiconductor material into a cathode semiconductor portion, a fuselink semiconductor portion, and an anode semiconductor portion, wherein said fuselink semiconductor portion laterally abuts said cathode semiconductor portion and said anode semiconductor portion;

forming a metal layer directly on at least an entirety of a top surface of said fuselink semiconductor portion;

partially etching a segment of said metal layer over a middle portion of said fuselink semiconductor portion, while not etching segments of said metal layer over two end portions of said fuselink semiconductor portion; and forming a first metal semiconductor alloy portion having a first thickness and a third metal semiconductor alloy portion having said first thickness at least on said two end portions of said fuselink semiconductor portion, while forming a second metal semiconductor alloy portion having a second thickness on said middle portion of said fuselink, wherein said second thickness is less than said first thickness.

2. The method of manufacturing an electrical fuse according to claim 1, wherein said first metal semiconductor alloy portion and said second metal semiconductor alloy portion have substantially the same composition.

3. The method of manufacturing an electrical fuse according to claim 2, wherein said first metal semiconductor alloy portion and said second metal semiconductor alloy comprise a metal suicide.

4. The method of manufacturing an electrical fuse according to claim 1, further comprising forming shallow trench isolation located in said semiconductor substrate, wherein said shallow trench isolation abuts said cathode semiconductor portion, said fuselink semiconductor portion, and said anode semiconductor portion.

5. The method of manufacturing an electrical fuse according to claim 1, wherein said cathode semiconductor portion, said fuselink semiconductor portion, and said anode semiconductor portion have substantially the same height.

6. The method of manufacturing an electrical fuse according to claim 1, wherein said cathode semiconductor portion, said anode semiconductor portion, said fuselink semiconductor portion arc doped substantially at the same doping concentration and with the same dopant type.

7. A method of manufacturing an electrical fuse comprising:

forming a layer of semiconductor material on a semiconductor substrate; patterning said layer of said semiconductor material into a cathode semiconductor portion, a fuselink semiconductor portion, and an anode semiconductor portion, wherein said fuselink semiconductor portion abuts said cathode semiconductor portion and said anode semiconductor portion;

forming a metal semiconductor alloy layer having substantially a first thickness directly on at least an entirety of a top surface of said fuselink semiconductor portion; and partially etching a segment of said metal semiconductor alloy layer over a middle portion of said fuselink semiconductor portion to a second thickness, while not etching segments of said metal semiconductor alloy layer over two end portions of said fuselink semiconductor portion, wherein said second thickness is less than said first thickness.

8. The method of manufacturing an electrical fuse according to claim 7, wherein said metal semiconductor alloy layer comprises a metal silicide.

9. The method of manufacturing an electrical fuse according to claim 7, further comprising forming shallow trench isolation located in said semiconductor substrate, wherein said shallow trench isolation abuts said cathode semiconductor portion, said fuselink semiconductor portion, and said anode semiconductor portion.

10. The method of manufacturing an electrical fuse according to claim 7, wherein said cathode semiconductor portion, said fuselink semiconductor portion, and said anode semiconductor portion have substantially the same height.

11. The method of manufacturing an electrical fuse according to claim 7, wherein said cathode semiconductor portion, said anode semiconductor portion, said fuselink semiconductor portion are doped substantially at the same doping concentration and with the same dopant type.

* * * * *